(12) United States Patent
Vanier

(10) Patent No.: US 6,320,472 B1
(45) Date of Patent: Nov. 20, 2001

(54) ATOMIC FREQUENCY STANDARD

(75) Inventor: Jacques Vanier, Notre Dame i Ilea Peurot (CA)

(73) Assignee: Kernco, Inc., Danvers, MA (US)

( * ) Notice: Subject to any disclaimer, the term of this patent is extended or adjusted under 35 U.S.C. 154(b) by 0 days.

(21) Appl. No.: 09/237,585

(22) Filed: Jan. 26, 1999

(51) Int. Cl.[7] .............................. H01S 1/06; H03B 17/00

(52) U.S. Cl. ............................................ 331/94.1

(58) Field of Search ............................................. 331/94.1

(56) References Cited

U.S. PATENT DOCUMENTS

| | | |
|---|---|---|
| 3,129,389 | 4/1964 | Packard et al. . |
| 3,798,565 | 3/1974 | Jechart . |
| 5,192,921 | 3/1993 | Chantry et al. . |
| 5,327,105 | 7/1994 | Liberman et al. . |
| 5,627,497 | * 5/1997 | Skoczen .............................. 331/94.1 |

OTHER PUBLICATIONS

Levi et al. "On the use of a modulated laser for hyperfine frequency excitation in passive Atomic Frequency Standard", Prco. of 11th EFTF, Neuchatel, Switzerland, p. 216, 1997.*

Alzetta et al, An Experimental Method for the Observation of R.F. Transitions and Laser Beat Resonances in Oriented Na Vapor, Nuovo Cimento, Nov. 11, 1976, pp. 5–20, vol. 36 B, No. 1.

CYR et al, All Optical Microwave Frequency Standard: A Proposal, IEEE Transactions on Instr. and Meas., Apr. 1993, pp. 640–649, vol. 42, No. 2.

Orriols, G., Nonabsorption Resonances by Nonlinear Coherent Effects in a Three–Level System, Nuovo Cimento, Sep. 11, 1979, pp. 1–24, vol. 53 B, No. 1.

Vanier et al, Coherent Population Trapping in Cesium: Dark Lines and Coherent Microwave Emission, Phys. Review A, Sep. 1998, pp. 2345–2538, vol. 58, No. 3.

Vanier et al, The Quantum Physics of Atomic Frequency Standards, vols. 1 & 2, 1989 Adam Hilger, Ed., IOP Publishing Ltd., Phila., Penn.

Godone A et al: "A new atomic frequency standard; the coherent population trapping Cs maser"; pp. 175–176; Jul., 1998 Conference on Precision Electromagnetic Measurements Digest (Cat. No. 98CH36254); Proceedings of Conference on Precision Electromagnetic Measurements; Washington, D.C.

Godone A et al: "Coherent microwave emission without population inversion; a new atomic frequency standard"; Jul., 1998; pp. 504–507; vol. 48, No. 2; Proceedings of Conference on Precision Electromagnetic Measurements; Washington, D.C.; IEEE Transactions on Instrumentation and Measurement, Apr., 1999.

(List continued on next page.)

Primary Examiner—Benny Lee
Assistant Examiner—Kimberly E Glenn
(74) Attorney, Agent, or Firm—Barry R. Blaker

(57) ABSTRACT

An atomic frequency standard based on the ground state hyperfine resonance line observed by means of coherent radiation fields creating Coherent Population Trapping (CPT) in an alkali metal atomic ensemble contained in a cell. The radiation fields are created by frequency modulating a laser at a subharmonic of the hyperfine resonance frequency of the alkali atomic ensemble chosen or by using two lasers whose frequency difference is equal to the hyperfine frequency of the alkali atoms. The hyperfine resonance signal is observed either on the fluorescence emitted by the alkali atoms contained in the cell or on the light transmitted through the same cell. This signal is used, through synchronous detection, to lock the frequency of the microwave generator used to modulate the laser (or to maintain the frequency difference between the two lasers), to the hyperfine resonance frequency of the alkali atoms, thereby implementing an atomic frequency standard.

18 Claims, 8 Drawing Sheets

OTHER PUBLICATIONS

Levi et al: "Cesium microwave emission without population inversion"; pp. 609–615; May, 1999; vol. 46, No. 3; IEEE Transactions on Ultrasonics, Ferroelectrics and Frequency Control.

Alzetta G. et al., Nuovo Cimento, B36, 5, 1976.*

Cyr N. et al. "All–Optical Microwave Frequency Standard: A Proposal", IEEE Trans. on Instr. and Meas. 42,2, 640, 1993.*

Levi F. et al. "On the Use of a Modulated Laser for Hyperfine Frequency Excitation in Passive Frequency Standards", Proc. of 11th EFTF, Neuchatel, Switzerland, p. 216, 1997.*

Orriols G. "Nonabsorption Resonance by Nonlinear Coherent Effects in a Three–Level System", Nuovo Cimento, 53, 1, 1979.*

Vanier J. et al. "Coherent Population Trapping in Cesium: Dark Lines and Coherent Microwave Emission", Phys. Rev. A, 58, 2345, 1998.*

Vanier J. and Audoin C. "The Quantum Physics of Atomic Frequency Standards", 1989, Adam Hilger, editor, Bristol, England.*

* cited by examiner

ATOMIC FREQUENCY STANDARD

BACKGROUND OF THE INVENTION

1. Field of the Invention

The present invention relates generally to the field of atomic frequency standards. In particular it relates to the class of standards generally known as passive atomic frequency standards in which the state of an atomic ensemble is prepared by means of optical pumping. More particularly, the invention is directed at using the coherence property of lasers, rather than their intensity, to accomplish the optical pumping and to implement a novel frequency standard with improved characteristics.

2. Description of the Prior Art

In some atomic frequency standards using alkali metal atoms, such as rubidium, optical pumping is used to prepare the atomic ensemble into a special state that allows the detection of the resonance signal which is used to lock a crystal oscillator to the transition F=1, $m_f$=0 to F=2, $m_F$=0 in the $S_{1/2}$ ground state corresponding to a frequency nhf= 6.835 GHz. These levels are identified in FIG. 1. The P state consists of two distinct levels $P_{1/2}$ and $P_{3/2}$ and transitions from the ground state $S_{1/2}$ can take place to either of those levels. The corresponding radiations have wavelengths, 780 nm (to $P_{3/2}$, termed the $D_2$ radiation) and 794 nm (to $P_{1/2}$, termed the $D_1$ radiation). The technique consists in manipulating the atomic ensemble in such a way as to alter the distribution of atoms in the hyperfine levels of the ground state and is termed "state selection". In the passive rubidium 87 frequency standards presently available commercially the state selection is done by exposing the resonance cell containing the rubidium 87 atoms to the radiation of a properly filtered rubidium 87 spectral lamp. The filtering is done by means of a cell containing rubidium 85 which absorbs radiation corresponding to the transition from the ground level F=2 to the excited P state leaving a spectrum containing radiation which is resonant with the transition from the ground level F=1 to the excited P state. This filtering takes place for both radiation wavelengths $D_1$ and $D_2$. This is termed the separated filter approach (Packard et al., U.S. Pat. No. 3,129,389). The net effect is to populate the ground hyperfine level F=2 at the expense of the F=1 level. The process is termed population inversion. In some cases the filter is incorporated directly in the resonance cell through the use of natural rubidium which contains about 70% of rubidium 85 and 30% rubidium 87 (Jechart, U.S. Pat. No. 3,798,565). This is termed the integrated filter approach. These approaches create a so-called population inversion.

Recently, substantial efforts have been directed, with relative success, at the replacement of the spectral lamp with a solid state diode laser emitting at the proper wavelength, either $D_1$ or $D_2$, but tuned to one of the hyperfine ground states (Liberman et al., U.S. Pat. No. 5,670,914). In the case of cesium, the pumping can only be done with a laser since no isotopic hyperfine filtering of a Cs spectral lamp is possible, cesium having no other stable isotopes.

In these approaches a buffer gas, not chemically active with the alkali atoms, is used to restrain the motion of the alkali atoms, thereby limiting relaxation of the same atoms on the walls of the containing cell and also preventing broadening by Doppler effect. The buffer gases have a strong temperature coefficient that makes the resonance frequency sensitive to environmental fluctuations. This is generally avoided through the use of a mixture of buffer gases having opposing temperature coefficients, in combination with appropriate temperature regulation of the cell.

The resonance cell, containing the ensemble of alkali atoms, is placed inside a microwave cavity tuned to the transition between which the population inversion has been created. The light transmitted is detected with the help of a photodetector, as shown in FIG. 1. It is to be noted that, upon optical pumping, the cell becomes transparent to the incident radiation since atoms are pumped out of the absorbing level, F=1. Microwave energy is fed to the cavity and its effect on the atoms, when tuned to the hyperfine frequency, is to alter the population of the two levels of the ground state and, consequently, the optical transmission of the ensemble. The ground state hyperfine resonance signal is thus detected on the transmitted light and is used to lock the frequency of the microwave source used to feed the cavity. The resulting device is a system whose frequency is locked to an atomic resonance.

Although this approach has achieved substantial success, it has, nonetheless, several disadvantages. In particular, the need for a microwave cavity limits availability of reduction in the dimensions of the device. This limitation has been a main factor in the selection of rubidium 87 (hyperfine frequency=6.8 GHz) over rubidium 85 (hyperfine frequency=3.0 GHz), the cavity size required being larger for rubidium 85 than for rubidium 87. The microwave cavity also introduces restrictions on the type of material from which the resonance cell can be fabricated due to microwave losses which, in certain cases, can reduce the cavity Q to such an extent that it loses its microwave properties. Another disadvantage of the approach is the presence of a primary shift caused by the optical pumping radiation itself: it is termed the light shift. This light shift effect is of substantial importance in the case of optical pumping by means of lasers; thus, several approaches have been proposed to minimize the effect. However, all such approaches devolve about critical and often difficult adjustments of physical parameters of the resonance cell, pumping source and isotopic filter. Moreover, as mentioned, the problem is amplified when a laser is employed to accomplish the optical pumping. Another difficulty is the requirement for frequency multiplication to the resonance hyperfine frequency in order to observe the resonance signal.

It should also be mentioned that the type of state selection just described does not use the coherence property of the optical pumping light source and is generally termed intensity optical pumping because it relies only on the intensity of the source and not on its coherence, even in the case wherein a laser is used to accomplish the optical pumping.

The present invention employs laser radiation to accomplish the optical pumping and relies on the coherence property, not the intensity, of said laser radiation. The invention uses the phenomenon of Coherent Population Trapping, hereinafter (CPT), to prepare the atoms into a coherent superposition of energy states. No intensity optical pumping is used and the ensemble ground state populations are not altered by the phenomenon. The population of both ground levels remain equal. CPT has been known for many years (Alzetta et al., 1976). It is best described by reference to FIG. 2 which represents the lower levels of the cesium atom as the exemplary alkali metal; and to FIG. 3 which shows an experimental arrangement to observe the phenomena.

The cesium atom ensemble is contained in a cell and is exposed to two coherent radiation fields at angular frequencies $\omega_1$ and $\omega_2$, as shown in FIG. 2. The difference between $\omega_1$ and $\omega_2$ corresponds to the cesium atom ground state angular hyperfine frequency $\omega_{hf}=2\pi\nu_{hf}$. The radiation fields can be the radiation produced by two lasers locked to each other or the sideband of a single laser modulated at a sub-harmonic frequency of the alkali atom hyperfine frequency. The effect of the two laser radiation fields is to produce a strong coherence in the ground state at the hyperfine frequency and inhibit all transitions to the excited state P. All atoms are trapped in the ground state, thus giving rise to the name Coherent Population Trapping. At exact resonance, $\omega_1-\omega_2=\omega_{hf}$, no transitions take place from the ground state to the excited state, no energy is absorbed from the laser radiation by means of transitions and no atoms are excited to the P state. If the frequency of one laser radiation is scanned around the resonance frequency of the transition in question, a sharp decrease in the intensity of the fluorescence from the resonance cell, as measured at right angle to the laser propagation, is observed. A similar but opposite resonance effect in other words, a sharp increase, is observed in the transmission of the laser radiation through the resonance cell. This resonance line effect, observed both in transmission and in fluorescence, reflects all the properties of the ground state hyperfine resonance as observed in the intensity optical pumping approach and can be used as in prior intensity optical pumping technology for implementing a frequency standard. This resonance line effect has the obvious advantage of being detected directly on the laser radiation without the need of an exciting microwave radiation, thus avoiding the need for a microwave cavity.

Suggestions have been made for using the phenomenon in implementing a frequency standard and two important studies have been published in this connection (Cyr et al., 1993 using rubidium and Levi et al., 1997 using cesium). The theory has been given in several articles (Orriols, 1979, Vanier et al., 1989, Vanier et al. 1998). In the first article (Cyr et al., 1993), the CPT resonance signal is observed by means of a probe beam derived from the same frequency modulated laser used to create the population trapping phenomenon. This approach, although having some possible advantages regarding signal to noise ratio, entails substantial complexity in the experimental arrangement. In the second article (Levi et al., 1997), the signal is disclosed to be observed directly on the fluorescence from a glass cell containing the cesium atomic ensemble; it is shown in particular that the resonance line has very interesting properties for implementing a CPT frequency standard but the study reported is limited to basic properties and principles of the CPT phenomenon.

It is a principal object of this invention to provide a practical embodiment of an atomic frequency standard based on CPT using either or both of the fluorescence or light transmission line effects.

It is also an object of this invention to provide a novel resonance cell for implementing a compact atomic frequency standard based on the CPT phenomenon.

Another object of the present invention is to provide a novel method and apparatus for effectuating the CPT Phenomenon employing a VCSEL laser.

It is still another object of the invention to provide novel means of locking the laser frequencies and their difference to the atomic resonance lines.

Another object of the invention is to provide an optically pumped atomic frequency standard wherein the adverse light shift observed in the intensity pumping approach is avoided or at least substantially ameliorated.

An additional object of the invention is to provide an optically pumped atomic frequency standard wherein the known benefits of the use of a buffer gas or a mixture of such buffer gases are maintained to prevent Doppler broadening, wall relaxation and broadening by transit time effects, and to provide a small temperature coefficient.

Other objects and advantages of the present invention will, in part, be obvious and will, in part, appear hereinafter.

SUMMARY OF THE INVENTION

To achieve the foregoing objects and in accordance with the purpose of the invention described herein, there is provided an optical physics package for use as part of an atomic frequency standard including at least one laser source for providing coherent radiation, a resonance cell and photodetectors for detecting the transmitted light and/or the fluorescence light and the phenomenon of CPT.

Preferably, the main core of the resonance cell containing the alkali atoms and the buffer gas is made of a material not reactive with the alkali metal atoms to avoid long term reactions which are known to cause long term frequency drifts of the standard. Transparent windows are sealed to the cell to allow laser radiation transmission and output of the fluorescence radiation. A metallic vacuum seal off is also provided that allows easy cold vacuum seal off, minimizing perturbation of the alkali atoms-buffer gas mixture. There is also provided means for modulating the laser or locking two lasers together to obtain two radiation fields whose frequency difference is equal to the hyperfine frequency of the alkali atom chosen.

There are provided means for simultaneous frequency locking of the laser radiation and of their difference to the optical spectral lines and to the hyperfine frequency, respectively.

In a broad sense the invention relates to the practical use of the CPT phenomenon to implement an optically pumped atomic frequency standard using alkali atoms without the need of a microwave cavity and for providing great liberty in design to achieve a very small size device with several substantial functional advantages over prior art intensity optically pumped standards.

BRIEF DESCRIPTION OF THE DRAWINGS

The accompanying drawings, which are incorporated in and constitute parts of the specification, are given for a fuller understanding of the prior art and the present invention and illustrate certain exemplary preferred embodiments of the present invention.

FIGS. 6 and 6A are schematic sectional side and end views, respectively, of a metallic resonance cell with windows suitable for use in the present invention.

DETAILED DESCRIPTION OF THE INVENTION

This invention relates to the realization of an atomic frequency standard based on the CPT phenomenon as observed in alkali metal atoms contained in a cell along with a single or a mixture of buffer gases and optically pumped by means of coherent laser radiation.

Figure 3:
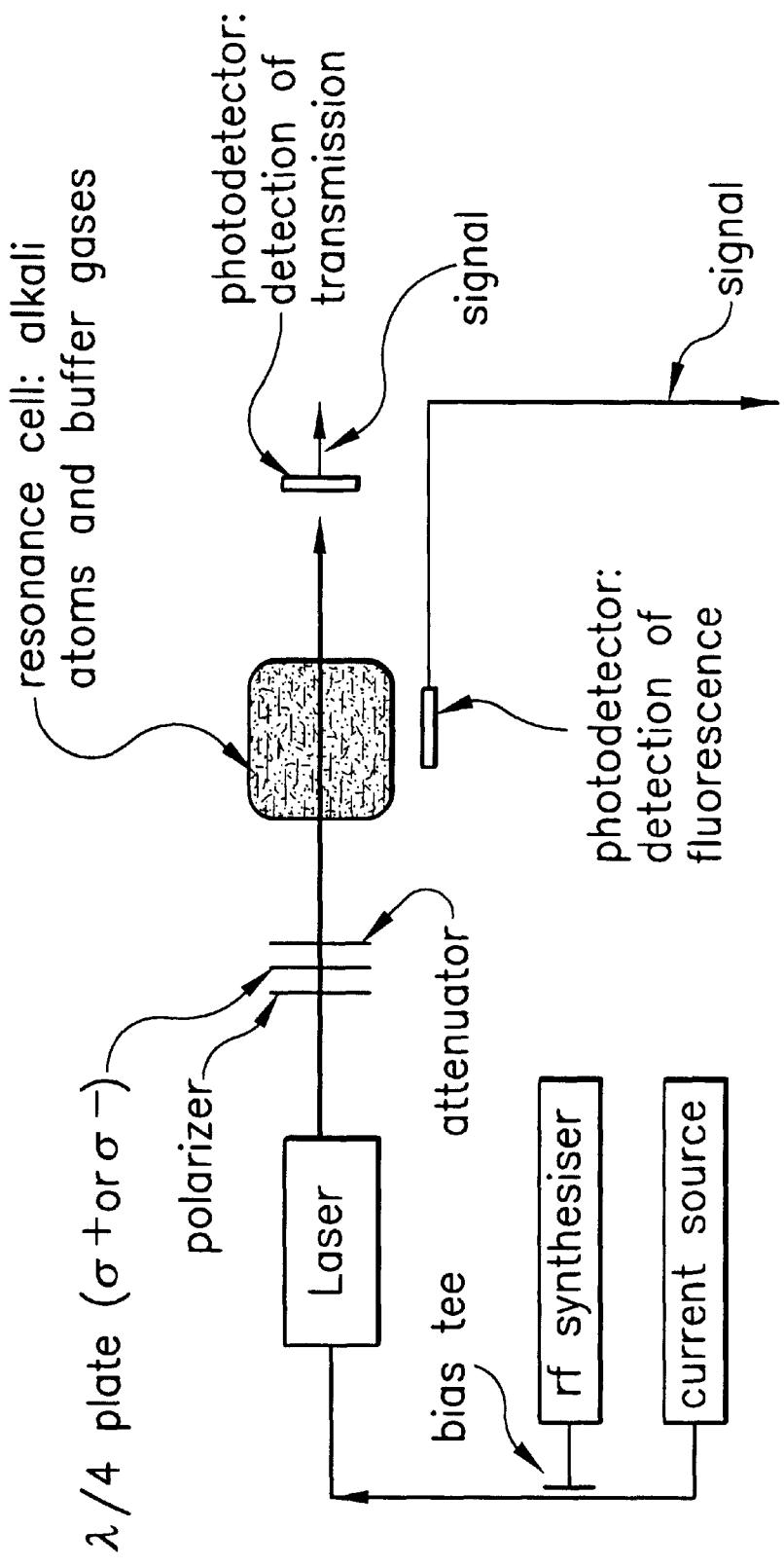
FIG. 3 is a schematic block diagram of an experimental system used to observe CPT.
Figure 4:
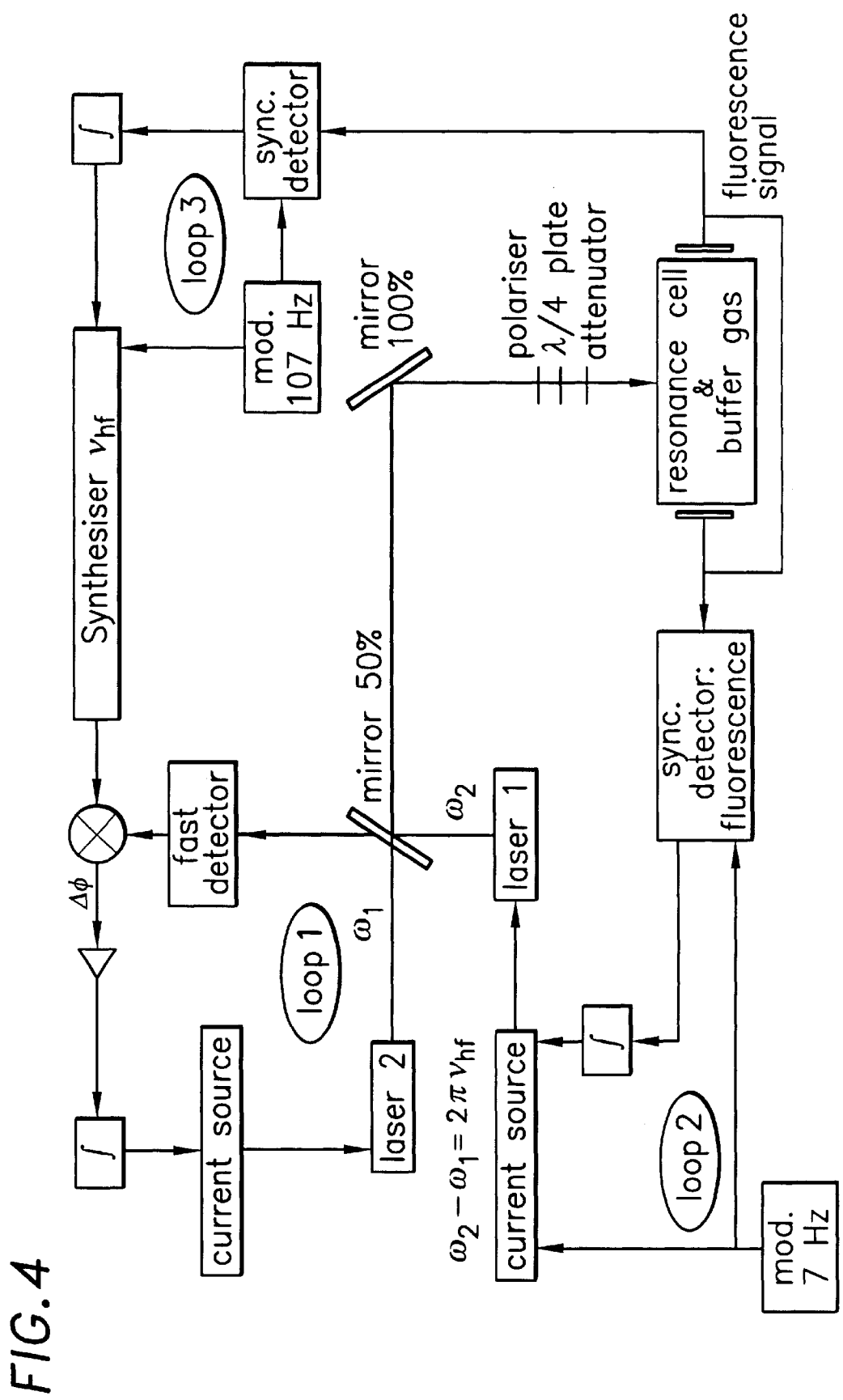
FIG. 4 is a schematic block diagram showing a technique for observing CPT employing two lasers phase locked to each other.

The schematic apparatus arrangement shown in FIG. 3 is illustrative of the principles of operation of the CPT atomic frequency standard of the invention. A laser modulated in frequency at a subharmonic of the hyperfine resonance of the alkali atom chosen creates sideband which function as the two radiation fields required to produce the CPT phenomenon. The modulation of the laser frequency can be done by superimposing on the laser driving current a microwave signal at the required frequency. Another method of modulation is by forcing the laser radiation through an external device such as an electro-optic modulator or other non-linear devices capable of producing phase changes in the optical radiation. In another embodiment, as shown in FIG. 4, two lasers are used, phase-locked to each other with a frequency separation equal to the hyperfine frequency of the alkali atom chosen.

The following table gives the frequency and wavelength to be used with selected alkali metals:

TABLE

| Alkali Metal | $\lambda(D_1)$ (nm) | $\lambda(D_2)$ (nm) | $V_{nf}$ (MHz) |
| --- | --- | --- | --- |
| Na 23 | 589.59 | 589.00 | 1771.63 |
| K 39 | 797.90 | 766.49 | 461.72 |
| Rb 85 | 794.76 | 780.02 | 3035.732 |
| Rb 87 | 794.76 | 780.02 | 6834.682 |
| Cs 133 | 894.35 | 852.11 | 9192.631 |

In the embodiment of FIG. 3 the laser radiation field consists of sideband. In the case wherein the modulation frequency is ½ the hyperfine frequency of the alkali atom, the two first sideband are separated exactly by a frequency equal to the alkali atom hyperfine frequency.

The resulting beam of radiation is passed through a linear polarizer followed by a quarter wave plate which acts as a circular polarizer. The resulting circularly polarized light is transmitted into the resonance cell. The alkali atoms inside the cell are submitted to the two radiation fields and the phenomenon of CPT, as described previously, takes place. The use of circularly polarized light is preferred because certain transitions within the alkali atom ensemble are forbidden when linear polarization is used.

When the frequency difference of the two sideband or the two radiation fields is equal to the hyperfine frequency a resonance takes place. This resonance is seen through its effect on the light transmitted through the resonance cell or on the light scattered by the resonance cell, that is, the fluorescence of the alkali atoms. With respect to fluorescence, the resonance is observed as a reduction of intensity while on the transmitted light the resonance is observed as an increase in transmission. Thus, these changes in fluorescence and/or transmission represent the signal. There are advantages in using the reduction of fluorescence intensity as the signal since it is not observed on a large transmission radiation background as in the case of the increase of transmitted light. The advantages, therefore, arise as a beneficial reduction of noise background.

Figure 5:
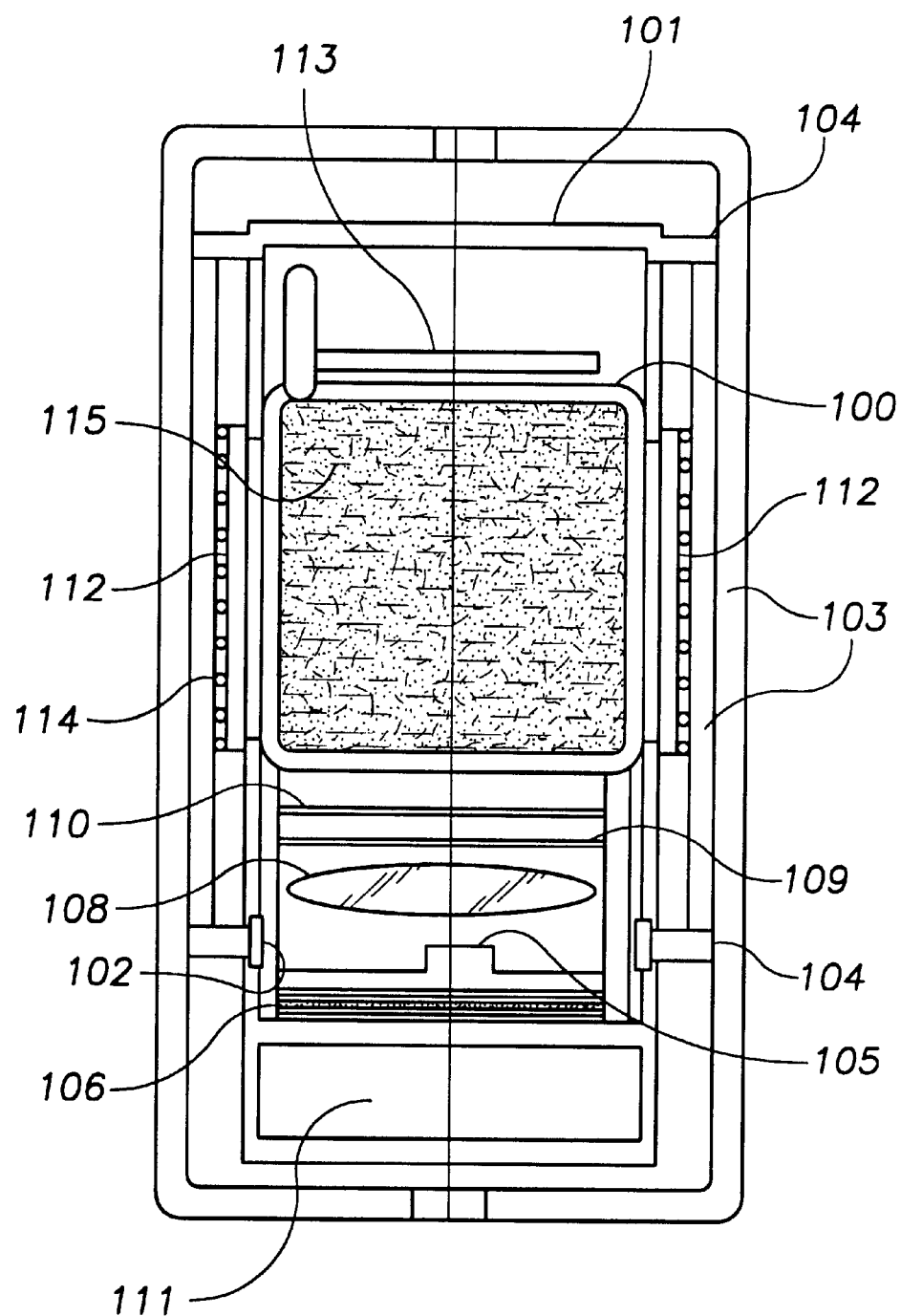
FIG. 5 is a schematic representation of one embodiment of a CPT optical package suitable for use in the atomic frequency standard of the invention.

A particular embodiment of an optical package using a glass cell is shown in FIG. 5. The various components are described below:

Resonance Cell 100: The cell is made of common glass as in the standard passive rubidium clock design. The alkali atoms used can be either rubidium 87, rubidium 85 or cesium 133. In the case wherein the system is used in the fluorescence mode, the buffer gas must not quench the scattered radiation; thus, nitrogen or methane must be avoided. Suitable buffer gases are neon and argon which can be mixed to produce a zero temperature coefficient. The cell being small, the total buffer gas pressure must be relatively high, of the order of 20 to 60 Torr in order to reduce fast diffusion and avoid wall relaxation. In the case of cesium it is not possible to operate the cell at high temperatures, say above 60° C. without considerable light absorption because the vapor density of the cesium atoms becomes too high. It is possible to avoid this effect to a certain extent through the introduction in the cell of another element such as potassium which has the property of reducing the vapor pressure by a factor of two, equivalent to a temperature change of 10° C.

Thermal enclosure 101: This is simply a cylinder made of high thermal conductivity material to maintain temperature constant throughout the resonance cell. It can be heated with a winding or a few heating elements such as power transistors in a heat dissipating mode. In the case a winding is used care should be taken to avoid the creation of magnetic fields. The enclosure 101 has openings on its side (not shown) to allow the detection of the fluorescence therethrough.

Heat stop and holder 102: The whole system is held inside the magnetic shields 103 that act as a support by means of spaced apart rings 104 of low heat conductivity. At the laser end of the resonance cell 100 the ring 104 acts as an insulator allowing the part of the assembly containing the laser diode 105 to operate at a temperature different from that of the resonance cell 100.

Laser 105 The optical package contains a Vertical Cavity Surface Emitting Laser 105. It is now possible to produce small Vertical Cavity Surface Emitting Lasers (VCSEL) with smooth tuning characteristics with temperature and driving current without mode jumps. They can be fabricated directly on a wafer containing about 20,000 units at relatively small cost. Thus, the VCSEL constitutes a preferred type of laser in the present invention.

Peltier element 106: The laser wavelength is very sensitive to temperature. The Peltier element 106 is used to maintain its temperature constant (thus adjusting its wavelength). Some lasers may require cooling while others may require heating depending on their specifications at the final stage of production.

Lens 108: The laser 105 output is divergent. The beam must be made parallel and expanded to some extent to use a section of the resonance cell as large as possible. This lens 108 or a combination of lenses is required to provide this function.

Linear and $\sigma_+$ or $\sigma_-$ polarizers 109 and 110, respectively: Theoretical analysis and experimental results show that the system operates with the largest signal output with light of circular polarization. It may be either $\sigma_+$ or $\sigma_-$.

Laser electronics coupling space 111: The laser 105 needs to be modulated at a subharmonic rf frequency of the resonance frequency of the alkali atoms in the cell. This may be in the microwave range depending on the efficiency of the modulation. This space is allocated for providing the coupling of the rf to the wire carrying the current to the laser diode. This may be done through strip-line technology.

Photodetectors 112 and 113: The photodetectors 112 and 113 are used to detect fluorescence and the transmission, respectively. The two signals are separated by two synchronous detectors tuned at different frequencies. The design calls for two photodetectors 112 for an increase in signal amplitude, although one could be sufficient. The transmission signal is imbedded in the transmission light. The same technique as the one used to detect flourescence is used.

Solenoid 114: This is a cylinder with a winding used to produce a magnetic field of the order of 100 mgauss, required to provide an axis of quantization to the atomic ensemble. The hyperfine frequency is only shifted slightly by a magnetic field (quadratic effect on the $m_F$ sublevels used).

Magnetic shields 103: Two layers of magnetic shielding, or more, are required to reduce the environmental magnetic field fluctuations which would affect the hyperfine frequency in second order.

Figure 6:
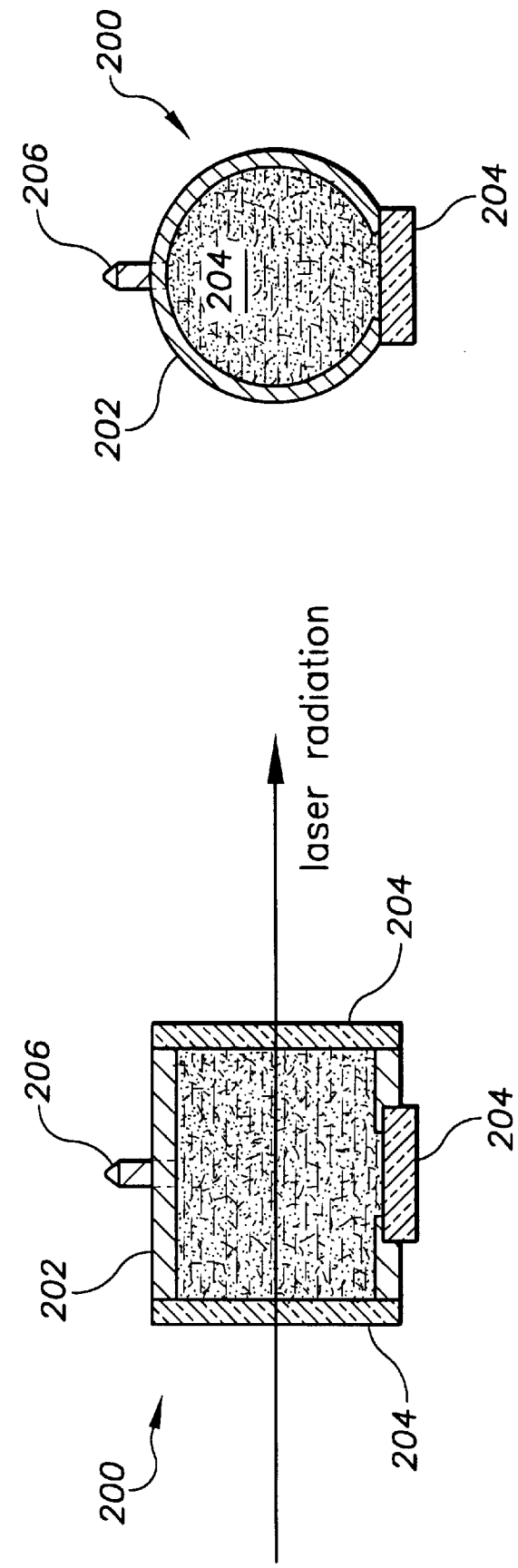

In the embodiment of FIG. 5 the mixture 115 of alkali metal atoms along with the chosen buffer gas are contained in a cell 100 composed entirely of glass. Referring now to FIGS. 6 and 6A, as an alternative to the glass cell of FIG. 5 there is shown a cell 200, comprising a tubular metallic element 202 made of a metal which is non magnetic and non reactive with the alkali metal atoms, such as silver, beryllium, titanium, copper, or molybdenum, and equipped with appropriate windows 204 made of a borosilicate glass such as exemplified by the glass wares manufactured under the trademark, PYREX, Corning Inc., Corning, N.Y., or sapphire. The tubular element 202 also comprises a pinch off 206, through which the alkali metal and buffer gas(es) are charged into the cell and then sealed therein. Such a cell is described in U.S. Pat. No. 5,327,105, to Liberman et al. In U.S. Pat. No. 5,327,105, the cell disclosed therein is described as serving joint functions: a) as a container for the alkali metal atoms, and b) as a microwave resonant cavity. In the present invention the cell is used only as a container for the buffer gas and the alkali atoms.

Figure 1:
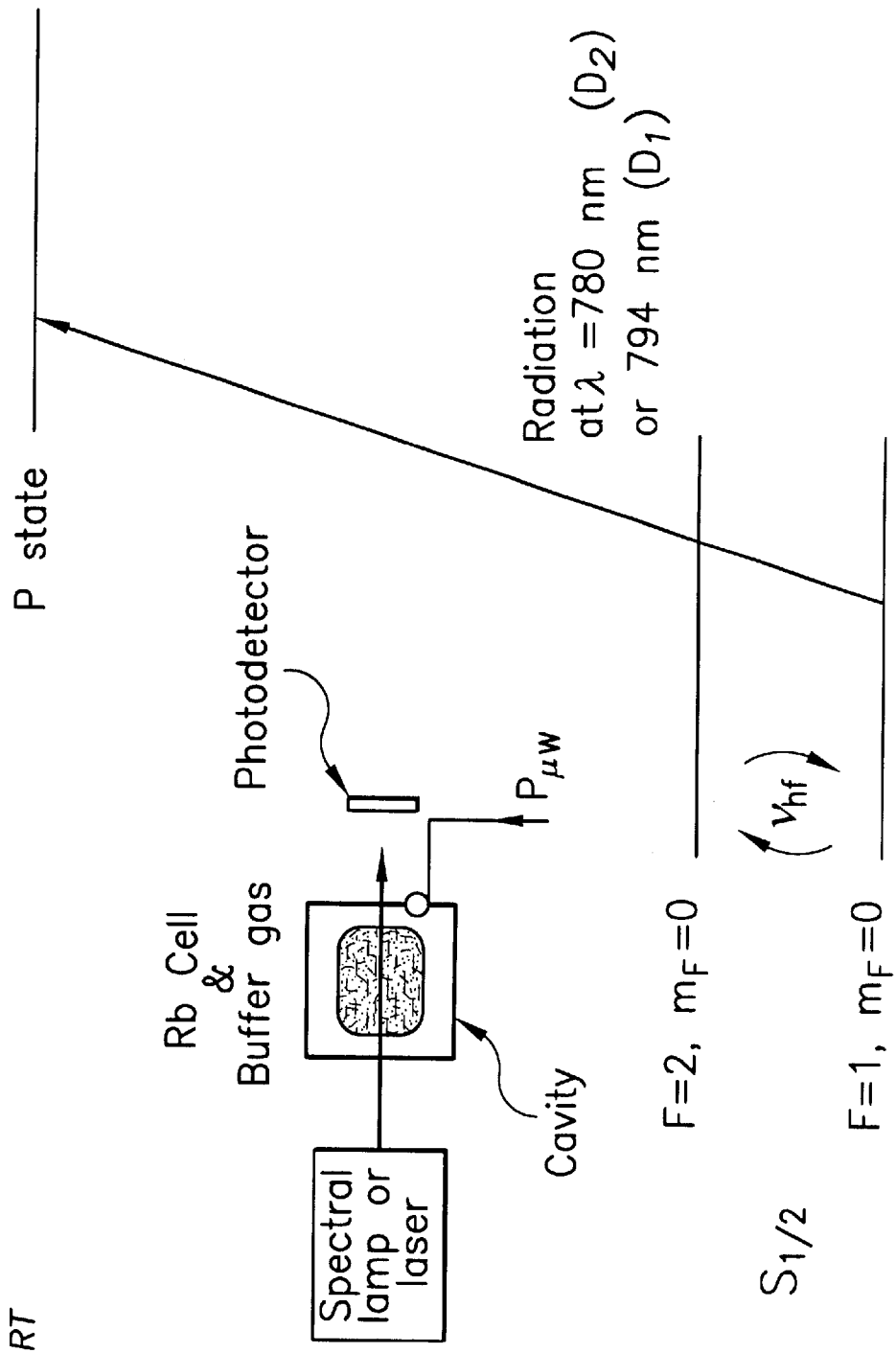
FIG. 1 is a diagram of the three lower states of the rubidium atom, along with a block diagram of the basic equipment employed, and was previously referred to herein in order to provide previous explanation of prior art in the construction of optically pumped frequency standards.
Figure 2:
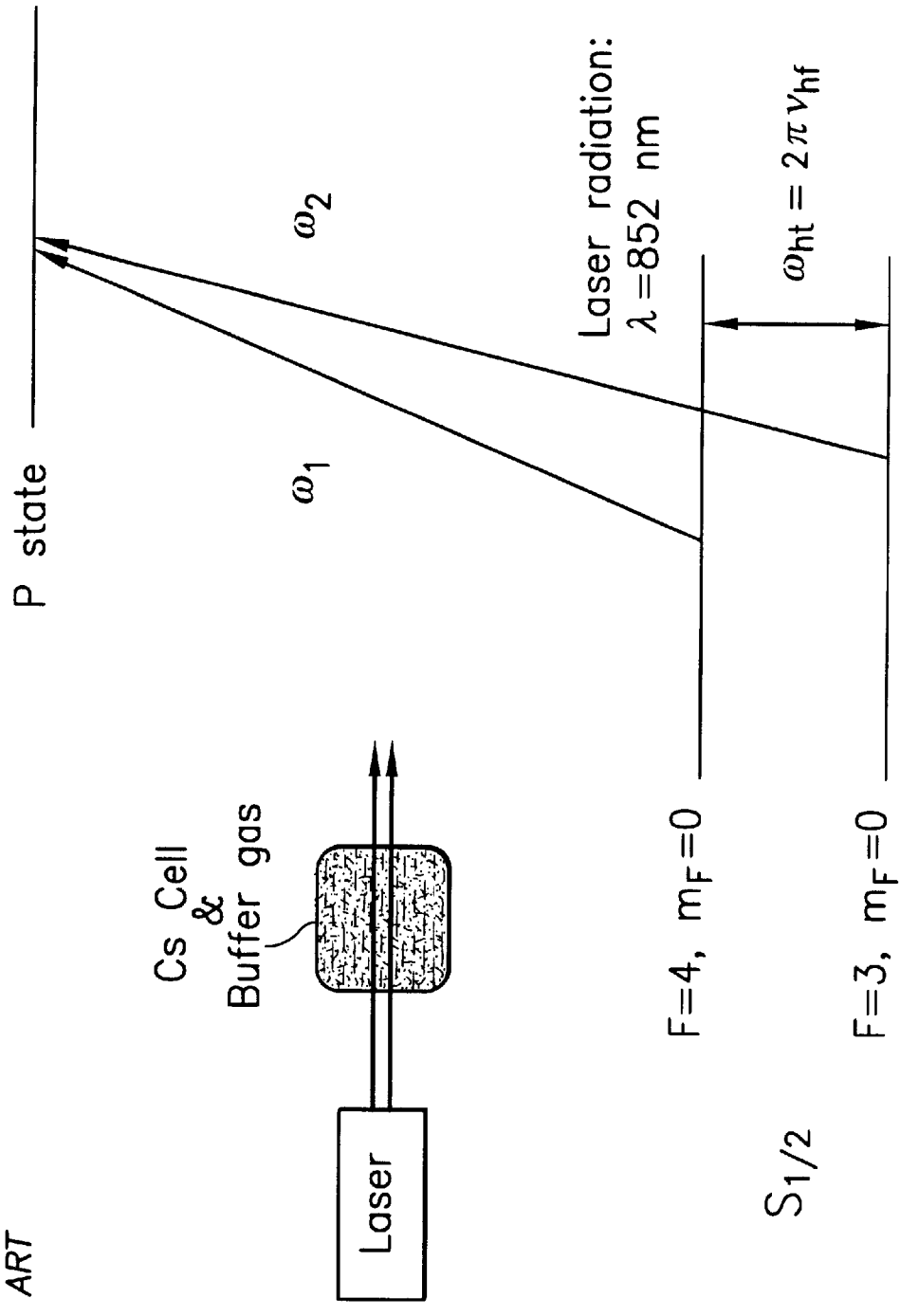
FIG. 2 is a diagram of the three lower states of the cesium atom, along with a block diagram of the basic equipment employed, and was previously referred to herein in order to provide explanation of the CPT phenomenon.
Figure 7:
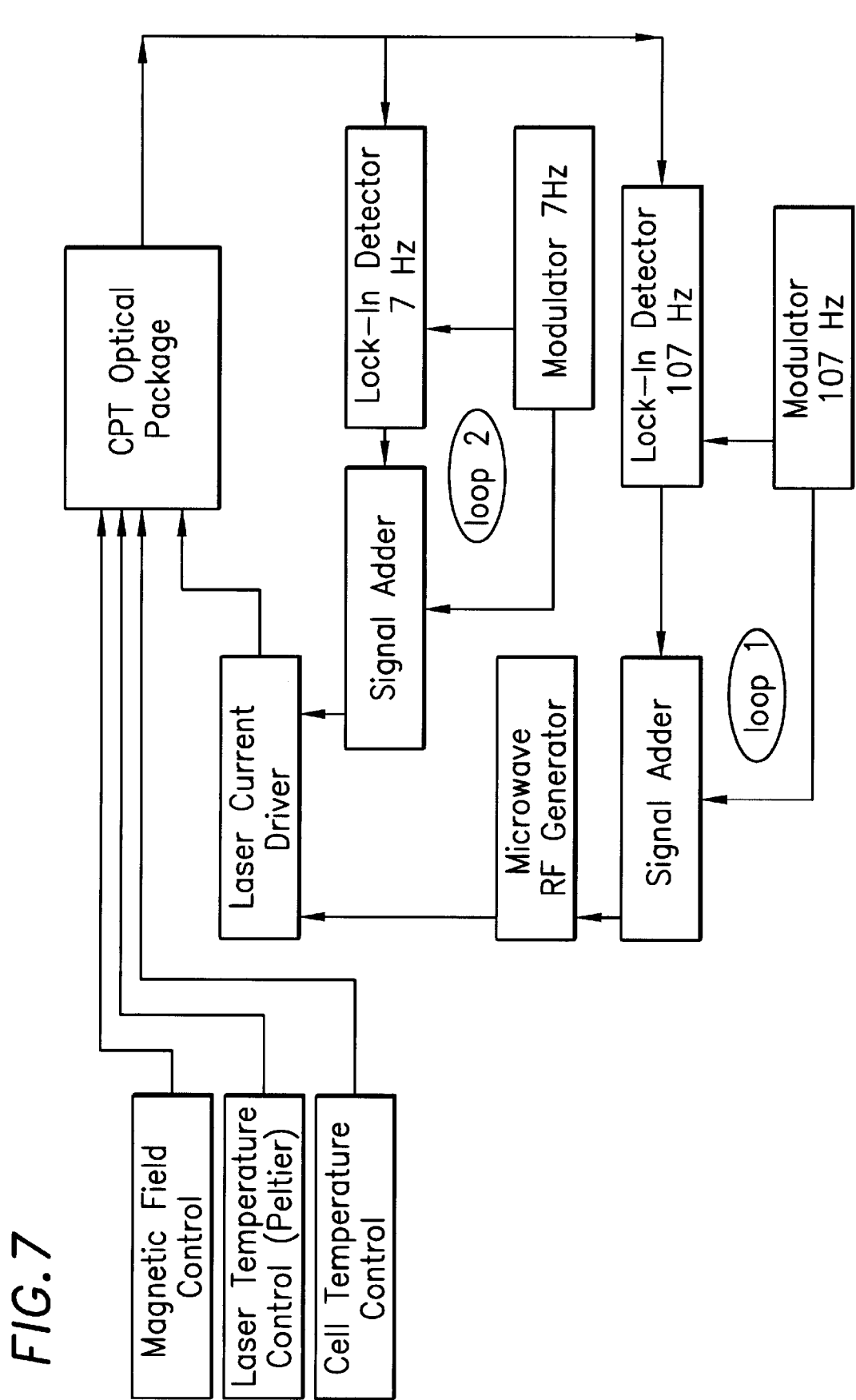
FIG. 7 is a block diagram of a CPT atomic frequency standard in accordance with the invention.

FIG. 7 is a block diagram of an atomic frequency standard and showing a technique for locking the frequency of the laser and of the rf generator used to modulate the laser (or to lock two lasers together) to the respective optical resonance line and the hyperfine frequency. The fluorescence signal observed is centered at a laser current such as to place the carrier between the two transitions from the F=4 and F=3 to the P state in the case of cesium. (Other similar levels are involved in the case of other alkali atoms). The carrier does not cause fluorescence if the width of the two lines corresponding to the two frequencies, $\omega_1$, $\omega_2$, as illustrated in FIG. 2, is narrow, thereby avoiding overlay of said lines. In such a case the fluorescence is caused only by the sideband created by the laser rf modulation. This phenomenon takes place only at a given current $i_o$ and a synthesizer frequency close to one half the 0-0 ground state hyperfine frequency. Although the fluorescence appears to come from the carrier at $i_o$ it is, in reality, the resonance effect of the sideband that cause the fluorescence.

Figure 8A:
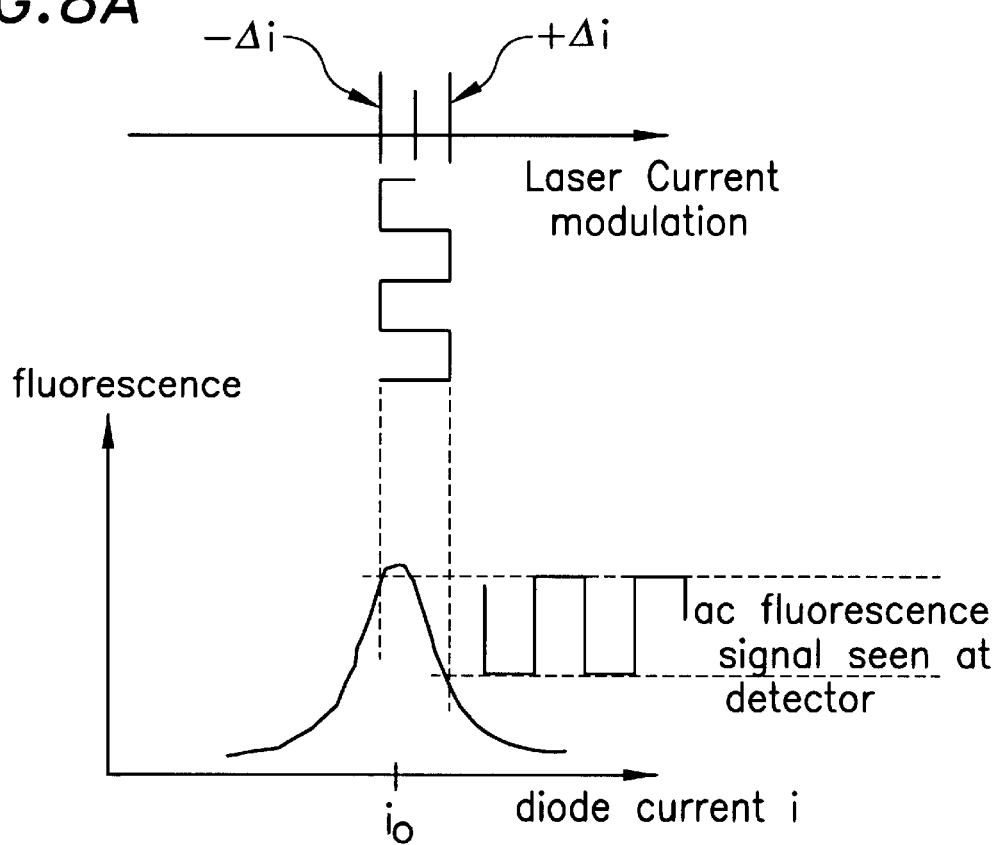
FIGS. 8A and 8B are illustrations of the modulation signals observed using the frequency locking technique described and illustrated in FIG. 7.
Figure 8B:
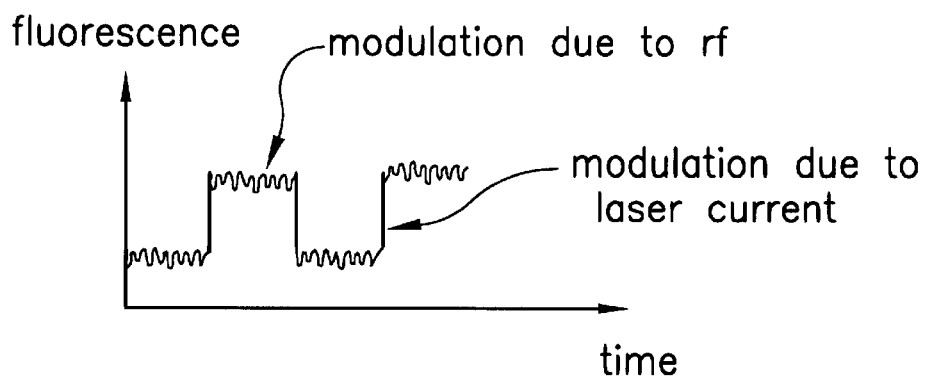

One manner of locking the frequency of the laser (or its wavelength) to the resonance frequency corresponding to the transitions between the ground state and the P state is by modulating the laser current at a low frequency as illustrated in FIGS. 8A and 8B. In the example shown the modulation is done at 7 Hz and a depth such as to modulate the laser by about 25 MHz, which is approximately 1/20 the line width of the optical resonance of alkali atoms in a buffer gas with a pressure of about 20 Torr. If the current i is not set such as to obtain exact resonance, the fluorescence as detected at the photodetector will appear as a modulated square wave as in the FIG. 8A. If i is centered, that is equal to $i_o$ the output at the detector will be a straight dc signal. A straight forward detection by means of a synchronous detector will provide a signal proportional to the detuning of the current from $i_o$ and this signal can be used to lock the laser frequency to the maximum of fluorescence through an integrator. This is shown as loop 2 of FIG. 7.

In this scheme, the laser current is never at $i_o$, and the fluorescence signal is not at maximum. Its size, however, does not vary greatly with i for small detunings of the laser compared to the optical line width. One modulates the frequency of the rf at a frequency, say, of 107 Hz. When the rf frequency is not tuned to exact resonance of the 0-0 transition, a signal at the rf modulation frequency will appear on the fluorescence signal which may also be modulated at the frequency of 7 Hz if the laser in not tuned to the frequency of the transition between the ground state and the P state. The resulting signal appears as shown in FIG. 8B. The 107 Hz modulation may be separated by means of a filter and detected with a synchronous detector. The output of the synchronous detector is then used as an error signal to lock the frequency of the rf generator to the hyperfine resonance line. This is shown as the loop 1 of FIG. 7.

While the foregoing description demonstrates certain preferred embodiments of the present invention and of techniques for the implementation and use thereof, it should be noted and understood that said description is not to be construed as limiting in nature because many obvious changes, modifications and variations may be made therein without departing from the essential scope, spirit or intention of the invention. For instance, although the frequency locking technique previously illustrated and described is based upon an analog approach, it is obvious that said frequency locking can also be achieved by techniques involving digital approaches in which the various modulation signals are separated in time and detected. Further, while the specific laser employed in the forgoing description is a VCSEL (Vertical Cavity Surface Emitting Laser), and while such type laser is presently preferred, it is obvious that any laser having the mechanical and light emitting properties required to excite the alkali atoms in the alkali/buffer gas(es) ensemble is acceptable for use in the present invention. For instance, a DBR (Distributed Bragg Reflector) type laser has also been successfully employed in obtaining the CPT phenomenon. Also, while not specifically mentioned hereinbefore, the interior surface of the resonance cell can be coated with an inert coating selected to prevent wall relaxation of the alkali atoms contacting said surface. Such coating can be, for instance, a long chain paraffinic wax such as PARAFLINT, manufactured by Moore and Munger, New York, N.Y. Accordingly, it is intended that the invention is to be limited only by the scope of the appended claims.

What is claimed is:

1. An atomic frequency standard comprising:
    (A) a cell containing an admixture of alkali metal atoms and a mixture of buffer gases non reactive with said alkali metal atoms, said mixture being selected to minimize the temperature coefficient within said cell;
    (B) at least one laser to excite said alkali metal atoms within said cell into resonance, light output of each said laser being of a wavelength corresponding to either of (a) $D_1$ or (b) $D_2$ transition of said alkali metal atoms, each laser's frequency being modulated by a rf generator over a frequency range including a subharmonic of a hyperfine ground state 0-0 transition frequency of said alkali metal atoms, thereby to achieve the phenomenon of Coherent Population Trapping whereby ground state populations of the resonant alkali metal atoms remain unaltered;

(C) a photodetector connected to detect at least one of (a) fluorescence of the laser excited alkali metal atoms within said cell or (b) light transmitted through said cell and produce a signal responsive thereto;

(D) a frequency control loop connected to receive said signal and, responsive thereto, to lock said rf generator to said hyperfine ground state frequency; and (E) a frequency control loop to receive said signal and, responsive thereto, to lock each said laser to the optical resonance line of said alkali metal atoms.

2. The standard of claim 1 wherein said at least one laser comprises a pair of lasers, the frequencies of said lasers being separated by hyperfine frequency of said alkali metal atoms.

3. The standard of claim 2 wherein said separation of frequencies is implemented by frequency locking of said lasers.

4. The standard of claim 2 wherein said separation of frequencies is implemented by phase locking of said lasers.

5. The standard of claim 1 wherein each said laser is a Vertical Cavity Surface Emitting Laser (VCSEL).

6. The standard of claim 1 wherein said alkali metal atoms are selected from the group consisting of cesium 133, rubidium 85 and rubidium 87.

7. The standard of claim 1 wherein an interior surface of said cell comprises an inert coating thereover selected to prevent wall relaxation of alkali metal atoms contacting said interior surface.

8. The standard of claim 7 wherein said inert coating is a long chain paraffinic wax.

9. The standard of claim 1 wherein a light polarizer is interposed between each said laser and said cell.

10. The standard of claim 9 wherein said light polarizer is a linear polarizer.

11. The standard of claim 9 wherein said light polarizer is a circular polarizer.

12. The standard of claim 9 comprising a combination of a linear polarizer and a circular polarizer.

13. The standard of claim 1 wherein said cell comprises a tubular element composed of a metal which is non magnetic and non reactive with the alkali metal atoms contained therein and a plurality of light transmissible windows sealed thereto.

14. The standard of claim 13 wherein said windows are composed of borosilicate glass.

15. The standard of claim 14 wherein said windows are composed of sapphire.

16. The standard of claim 1 wherein the intensity of light transmission through the cell is detected as a signal and wherein said buffer gas mixture is methane and nitrogen, thereby to quench fluorescence radiation within said cell and mitigate against relaxation by said fluorescence radiation.

17. The standard of claim 1 wherein the intensity of fluorescence within the cell is detected as a signal and wherein each said buffer gas of said buffer gas mixture is selected so as to avoid quenching of said fluorescence.

18. The standard of claim 17 wherein one of said buffer gases is neon.

* * * * *